US008877003B2

(12) United States Patent
Silberberg et al.

(10) Patent No.: US 8,877,003 B2
(45) Date of Patent: Nov. 4, 2014

(54) METHOD FOR THE PLASMA CLEANING OF THE SURFACE OF A MATERIAL COATED WITH AN ORGANIC SUBSTANCE AND THE INSTALLATION FOR CARRYING OUT SAID METHOD

(75) Inventors: Eric Silberberg, Rhode-Saint-Genese (BE); Eric Michel, Uckange (FR); Francois Reniers, Watermael-Boitsfort (BE); Claudine Buess-Herman, Overijse (BE)

(73) Assignee: Usinor, Puteaux (FR)

( * ) Notice: Subject to any disclaimer, the term of this patent is extended or adjusted under 35 U.S.C. 154(b) by 441 days.

(21) Appl. No.: 12/631,193

(22) Filed: Dec. 4, 2009

(65) Prior Publication Data
US 2010/0139864 A1 Jun. 10, 2010

Related U.S. Application Data

(62) Division of application No. 10/504,596, filed as application No. PCT/FR03/00542 on Feb. 19, 2003, now Pat. No. 7,674,339.

(30) Foreign Application Priority Data

Feb. 19, 2002 (FR) ..................................... 02 02057

(51) Int. Cl.
*C23F 1/00* (2006.01)
*H01L 21/306* (2006.01)
*B08B 7/00* (2006.01)
*H01J 37/32* (2006.01)
*C23G 5/00* (2006.01)

(52) U.S. Cl.
CPC ......... *H01J 37/32348* (2013.01); *B08B 7/0035* (2013.01); *C23G 5/00* (2013.01)
USPC .............. 156/345.38; 156/345.2; 156/345.44; 156/345.55

(58) Field of Classification Search
USPC ............. 118/718; 156/345.2, 345.38, 345.44, 156/345.55
See application file for complete search history.

(56) References Cited

U.S. PATENT DOCUMENTS 4,871,416 A * 10/1989 Fukuda ......................... 438/708
4,980,196 A * 12/1990 Yasuda et al. ................. 427/539
(Continued)

FOREIGN PATENT DOCUMENTS

DE 43 08 632 A1 9/1994
DE 43 32 866 A1 3/1995
WO 02/43781 A1 6/2002

OTHER PUBLICATIONS

D. Corzec et al.; "Cleaning of Metal Parts in Oxygen Radio Frequency Plasma"; Process Study; 8257a Journal of Vacuum Science & Technology A 12; Mar./Apr. 1994, No. 2, Woodbury, NY, US pp. 369-378.

*Primary Examiner* — Parviz Hassanzadeh
*Assistant Examiner* — Nathan K Ford
(74) *Attorney, Agent, or Firm* — Sughrue Mion, PLLC; Richard C. Turner

(57) ABSTRACT

The invention relates to a method of cleaning the surface of a material that is coated with an organic substance. The inventive method is characterized in that it comprises the following steps, consisting in: introducing the material into a treatment chamber, having a pressure of between 10 mbar and 1 bar therein, which is supplied with a gas stream containing at least 90 volume percent of oxygen; and generating a plasma by passing an electric discharge between the surface of the material and a dielectric-covered electrode in order to break down the organic substance under the action of the free radicals O thus produces. The invention also relates to an installation that is used to carry out said method.

17 Claims, 4 Drawing Sheets

(56) References Cited

U.S. PATENT DOCUMENTS

| | | |
|---|---|---|
| 5,529,631 A | 6/1996 | Yoshikawa et al. |
| 5,725,909 A * | 3/1998 | Shaw et al. ............... 427/412.1 |
| 5,803,976 A * | 9/1998 | Baxter et al. ............... 118/726 |
| 5,938,854 A | 8/1999 | Roth |
| 5,968,377 A | 10/1999 | Yuasa et al. |
| 6,083,355 A * | 7/2000 | Spence ............... 204/164 |
| 6,089,186 A * | 7/2000 | Kisoda et al. ............... 118/723 E |
| 6,387,602 B1 * | 5/2002 | Hayden et al. ............... 430/327 |
| 2002/0020357 A1 * | 2/2002 | Akiyama ............... 118/723 VE |
| 2002/0096994 A1 * | 7/2002 | Iwafuchi et al. ............... 313/495 |

* cited by examiner

METHOD FOR THE PLASMA CLEANING OF THE SURFACE OF A MATERIAL COATED WITH AN ORGANIC SUBSTANCE AND THE INSTALLATION FOR CARRYING OUT SAID METHOD

This is a divisional of application Ser. No. 10/504,596 filed Apr. 8, 2005, which is a National Stage Application filed under §371 of PCT Application No. PCT/FR03/00542 filed Feb. 19, 2003, which is based on the French Application No. 0202057, filed Feb. 19, 2002. The entire disclosures of the prior applications, PCT Application No. PCT/FR03/00542 and application Ser. No. 10/504,596 are hereby incorporated by reference in their entirety.

BACKGROUND OF THE INVENTION

The present invention relates to a process for cleaning, by means of a plasma at a pressure between 10 mbar and 1 bar, the surface of a material coated with an organic substance, and to an installation for implementing this process, more particularly one intended for cleaning metal strip.

Within the context of the present application, the expression "organic substance" is understood to mean any water-insoluble compound containing carbon, oxygen and hydrogen.

DESCRIPTION OF THE PRIOR ART

Strip coming from the various manufacturing lines are generally covered with an oil film which may have come from two sources. Firstly, this film may have been applied by spraying protective oil, so as to protect the surface of the strip from corrosion. However, it may also derive from a residual oil film in the case of strip coming from a cold rolling mill or skin-pass. In both cases, the oil coating weights may be up to several hundred mg per $m^2$.

To deposit a metal or organic coating on such strip requires the removal of the oil film during a degreasing operation, in order to obtain good adhesion of this coating. The techniques generally employed for this purpose on industrial lines must not overheat the strip so as to preserve the mechanical properties of the steel strip.

Thus, the most common of these techniques consists of an alkaline degreasing operation which may or may not be assisted by an electrolytic process. For environmental reasons, this process requires the installation of complex ancillary workshops for the reprocessing of eco-toxic co-products.

Other technical solutions are used to prevent the formation of such co-products, such as for example laser ablation, which has the effect of desorbing the organic compounds photochemically, but does not allow strips to be treated at speeds exceeding 10 m/min for lack of power.

It has recently been discovered that an advantageous cleaning technique consists in using a plasma at a pressure close to atmospheric pressure, produced by means of dielectric barrier discharges in oxygen-containing gas mixtures. A reaction then occurs between the reactive oxygen species (O., etc.) that are formed and the organic compounds of the oil, with production of carbon dioxide and water.

A dielectric barrier discharge has the advantage in particular of generating a cold plasma, which does not degrade the characteristics of the strip.

However, to obtain a stable and homogeneous discharge at pressures close to atmospheric pressure generally requires having a mixture consisting very predominantly of helium. The proportion of oxygen in the mixture is therefore low, and it is found that the treatment is not sufficiently rapid, probably because of the low density of reactive oxygenated species, but also because of inopportune polymerization of the organic substance to be removed.

Thus, U.S. Pat. No. 5,529,631 describes the treatment of plastics running through by a cold atmospheric-pressure plasma. The discharges are stabilized in gas mixtures based on helium with optionally up to 25% by volume of another gas. The technique requires strict control of the atmosphere in the plasma chamber by fitting an airlock at the inlet and outlet of the vessel. The use of helium as plasma gas and the complexity of the equipment makes this process as expensive and as difficult to implement as a conventional vacuum process. Furthermore, it does not allow degreasing of a strip running at a speed of greater than 3 m/min.

Moreover, U.S. Pat. No. 5,938,854 describes a process for cleaning plastic and metallic surfaces by a homogeneous glow discharge initiated in air at pressures between 10 torr and 20 bar. In addition to complex equipment, working at these pressure in air requires the discharge striking voltage, which is directly proportional to the pressure, to be considerably increased.

SUMMARY OF THE INVENTION

The object of the present invention is therefore to make available a process for cleaning the surface of a material coated with an organic substance that makes it possible to obtain uniform cleaning of said surface at a treatment rate of at least 10 m/min and at pressures close to atmospheric pressure.

For this purpose, a first subject of the invention consists of a process for cleaning the surface of a material coated with an organic substance, comprising the steps consisting in:
  introducing said material into a treatment chamber, having a pressure of between 10 mbar and 1 bar therein, which is supplied with a gas stream containing at least 90% oxygen by volume; and
  generating a plasma by passing an electric discharge between the surface of said material and a dielectric-covered electrode, so as to break down said organic substance through the action of the free radicals O. thus produced.

The present inventors have found that this process allows the substrate to be treated uniformly and rapidly, although the discharge obtained in this gas mixture consisting predominantly of oxygen is not homogeneous. The discharge mode seems to lie between filamentary discharge and cold arc. This is because the uncharged active species O. generated by the plasma are distributed over the surface of the strip through the action of the flux and independently of the electric field, and uniformly remove the material coated with organic substance, owing to their increased density due to the high proportion of oxygen that is present.

DESCRIPTION OF THE PREFERRED EMBODIMENTS

In a preferred method of implementation, the oxygen and/or ozone molecules that are formed by recombination of the free radicals O. produced in said plasma are re-dissociated. It is thus possible to increase the density of uncharged active species that are distributed over the surface of the strip independently of the electric field, further improving the uniformity of the treatment.

This re-dissociation may be carried out by means of UV radiation of suitable wavelength, which allows the ozone produced by recombination away from the cold arcs to dissociate into molecular oxygen and into the radical O.

In another preferred method of implementation, a sinusoidal voltage, the frequency of which is between 10 and 100 kHz, is applied in order to initiate the discharge. Indeed, this type of voltage results in the almost continuous presence of active species in the inter-electrode space, thereby making it possible to achieve high kinetic yields.

In another preferred method of implementation, the energy dissipation in the discharge is less than 40 W/cm$^2$ and the voltage applied in order to initiate the discharge is less than 4.4 kV.

The present inventors have in fact found that the inhibiting effects due to the polymerization of the oil are greater the higher the applied voltage and that the surface treatment is nonuniform. This is because the oxidation and elimination of the oil take place essentially at the point where the discharges impact on the strip, whereas the oil polymerizes away from these more intense glow channels. Increasing the voltage across the terminals of the discharge results in an increase in the energy of the electrons that all the more easily initiate the polymerization of the oil.

The process according to the invention may furthermore have the following features, individually or in combination:
- the voltage applied in order to initiate the discharge is sinusoidal;
- the material is in the form of a running strip and the various steps of the process are carried out continuously by means of installations placed in succession along the path of the running strip;
- one of the faces of the material is treated followed by the other;
- the material to be treated is a metallic material, preferably a carbon steel; and
- the process is carried out in order to degrease the surface of metallic materials, prior to a coating being deposited on this surface.

A second subject of the invention consists of an installation which comprises at least one module comprising a treatment chamber, means for setting the pressure inside said chamber to a value between 10 mbar and 1 bar, means for making said grounded strip run through said chamber, a series of dielectric-covered electrodes placed so as to face that surface of said strip to be treated, these electrodes being connected to a sinusoidal high-voltage generator, means for supplying said chamber with gas and means for extracting from said chamber the gases resulting from the decomposition of the organic substance coating the strip.

In a preferred embodiment, said installation comprises a succession of an even number of said modules, through which said strip runs in succession, exposing in turn one of its faces to the electrodes of said modules.

In another preferred embodiment, said installation furthermore includes UV emission lamps placed between said electrodes.

DESCRIPTION OF THE DRAWINGS

The invention will be illustrated by the description of two embodiments given by way of indication, but implying no limitation, with reference to the appended drawings in which:

FIG. 1 shows a diagram of an installation according to the invention for implementing the process according to the invention, in order to treat a metal strip made for example of carbon steel. This installation comprises a module 1 consisting of a treatment chamber 2 in which there is a cooled roll 3 around which the metal strip 4 runs. The roll 3 and the strip 4 are grounded. Pumps (not shown) allow the pressure inside this chamber 2 to be set to a value between 10 mbar and 1 bar. Electrodes 5a, 5b, 5c, 5d, 5e, 5f and 5g covered with a dielectric (alumina) are placed so as to face the strip 4. These electrodes 5a, 5b, 5c, 5d, 5e, 5f and 5g are connected to the high voltage supplied by a medium-frequency sinusoidal generator 6 (the frequencies being between 10 and 100 kHz). The high-voltage electrodes 5a, 5b, 5c, 5d, 5e, 5f and 5g are also cooled. In order to optimize the energy invested in the discharge, the fixing of the high-voltage electrodes 5a, 5b, 5c, 5d, 5e, 5f and 5g allows the inter-electrode distance to be varied.

The module also includes means for supplying said chamber with gas, and means for extracting from said chamber the gases resulting from the decomposition of the organic substance coating the strip 4 (these means not being shown).

In this particular embodiment, UV lamps 7a, 7b, 7c, 7d, 7e and 7f are placed between the high-voltage electrodes 5a, 5b, 5c, 5d, 5e, 5f and 5g so as, on the one hand, to allow the treatment at the discharge to be made uniform and, on the other hand, to allow the ozone, which is formed away from the inter-electrode volume, to dissociate. Consequently, the strip 4 may continue to be degreased away from the inter-electrode space by the O. radicals coming from the dissociative absorption of the ozone induced by applying the additional UV (253 nm) radiation.

Figure 1:
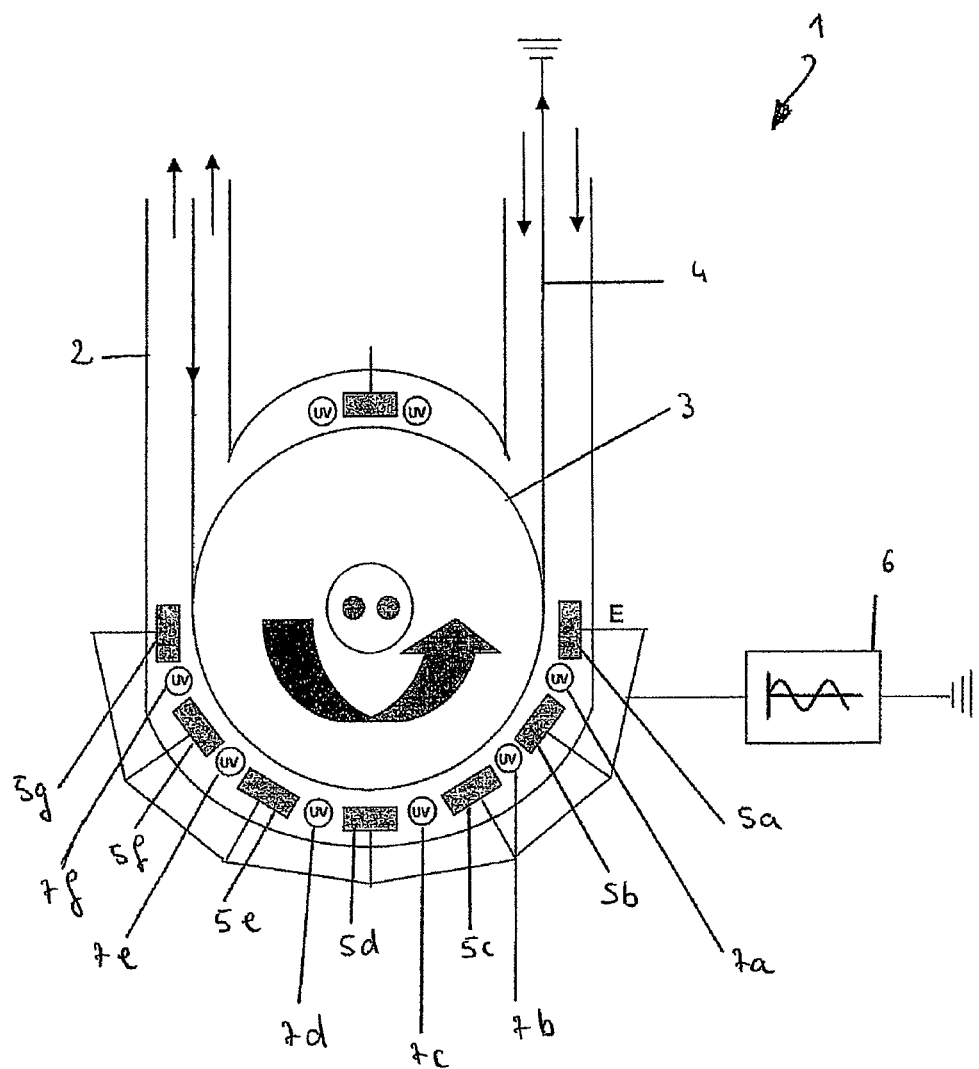
FIG. 1 shows a schematic view of a treatment installation according to the invention.
Figure 2:
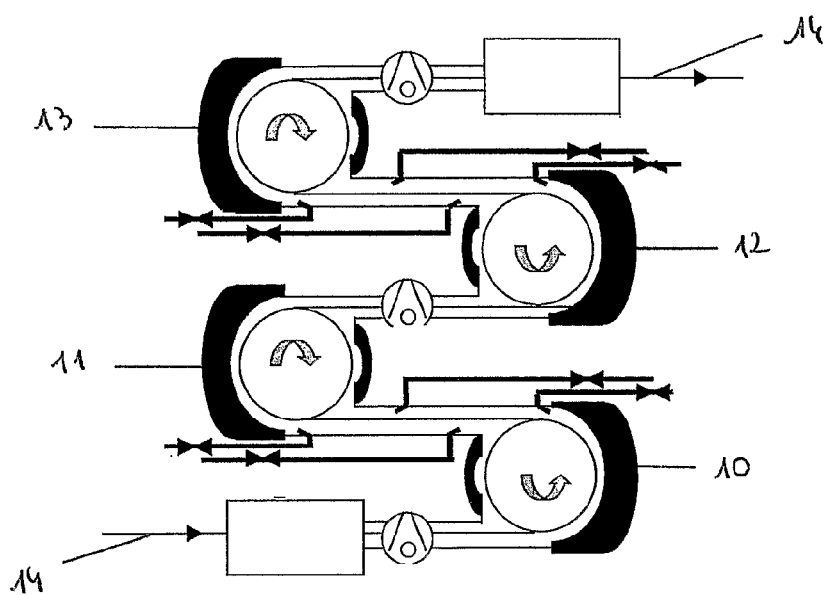
FIG. 2 shows a schematic view of a treatment installation according to the invention for a successive treatment of the two faces of a material in the form of a running strip.

FIG. 2 is a schematic representation of an installation according to the invention that comprises a succession of four modules 10, 11, 12 and 13 for carrying out a successive treatment of both faces of a running strip 14. The four modules 10, 11, 12 and 13 are connected together via intermediate components housing the pumping set and the gas injection system, which ensures that the installation is exposed to the stream and therefore ensures that the treatment is uniform, despite the characteristics of the inhomogeneous discharge.

EXAMPLES

Trials were carried out on small-sized (20 to 25 cm$^2$) strips in static mode, these being coated with a protective oil (Tinnol 200® from Quaker Chemical) as it was necessary to complete the degrease, in order to simulate a cleaning treatment before coating.

Apparatus Used

The trials were carried out in a dielectric barrier reactor consisting of an electrode covered with a 0.7 mm layer of alumina and of a grounded metal electrode over which the strip to be treated is placed. The alumina-covered electrode was connected to the high voltage (350 to 4400 V). The high voltage was delivered by a medium-frequency (3 to 30 kHz) sinusoidal generator. The two electrodes were equipped with a cooling system allowing them to remain at temperatures close to ambient temperature during operation of the plasma.

The inter-electrode distance may be set between one millimeter and several tens of millimeters.

Example 1

Two identical carbon steel strips, coated with a 186 mg/m$^2$ protective oil layer were treated. The other parameters were identical for the two treatments, namely:

200 mbar of oxygen;
12 kHz sinusoidal voltage; 3.6 kV; current: 30 mA;
inter-electrode distance: 5 mm.

Figure 3A:
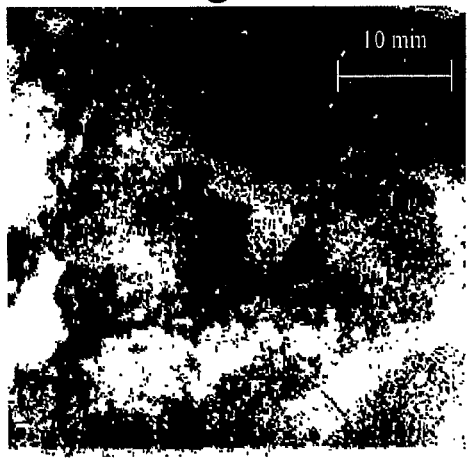
FIGS. 3A and 3B show two images of surfaces of strip treated in the presence of UV irradiation (FIG. 3B) and without said irradiation (FIG. 3A)
Figure 3B:
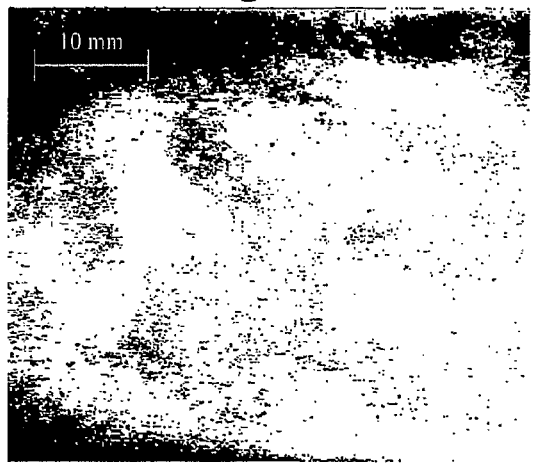

The strip treatments illustrated in FIGS. 3A and 3B differ only by UV radiation being imposed in one case and not in the other.

FIG. 3 shows images of the surface of strips treated by a discharge initiated in just oxygen, with (FIG. 3B) and without (FIG. 3A) additional UV (253 nm) irradiation. The dark areas correspond to the non-greased regions where the oil has polymerized.

It may be seen that applying UV radiation in addition to the discharge results in less polymerization of the oil, thus allowing better cleaning, in a shorter time.

Applying UV radiation whose wavelength corresponds to the dissociative absorption of ozone results in the uniform presence of oxygen radicals on the surface of the strip that allow cold combustion of the oil.

Applying UV radiation in addition to the discharge results not only in a more uniform distribution of the oxygen radicals on the surface of the strip, but it also increases the density of the O radicals, all the discharge parameters (voltage, frequency of application of the voltage, current, pressure and inter-electrode distance) remaining constant.

Figure 4:
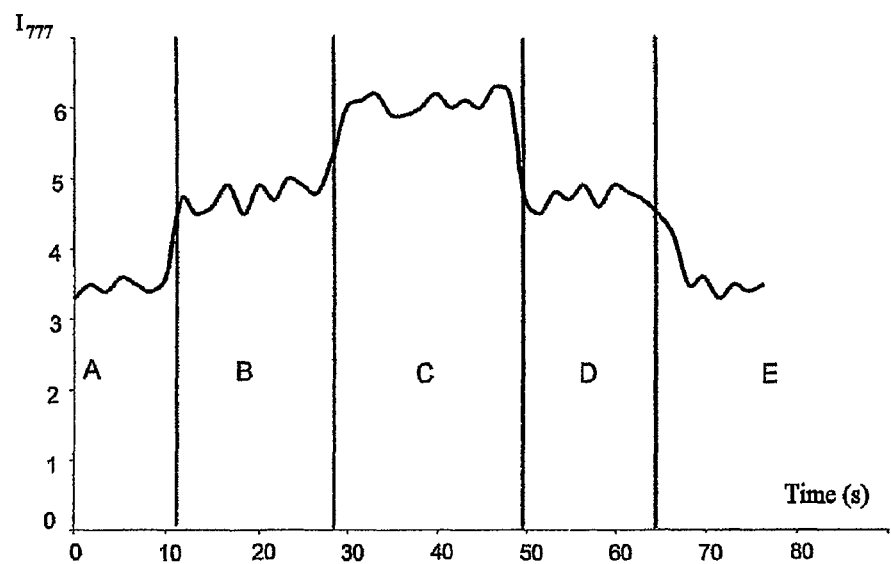
FIG. 4 demonstrates the increase in density of the oxygen radicals during the additional application of UV radiation at 253 nm.

FIG. 4 demonstrates the increase in density of the oxygen radicals during application of 253 nm UV radiation by means of optical emission spectroscopy (OES). The emission wavelength of the excited oxygen radicals lies at about 777 nm. This figure shows the intensity $I_{777}$ of the radiation at 777 nm as a function of time t. The various regions of the graph correspond to the following phases:

zone A: no electrical discharge or UV radiation applied. The recorded intensity corresponds to the background noise;
zone B: an electric discharge has been applied in pure oxygen, without UV radiation being applied;
zone C: in addition to the electric discharge, UV radiation at 253 nm has been applied;
zone D: the UV radiation is maintained, but in the absence of electrical discharge; and
zone E: the UV radiation is stopped and the background noise returns.

Example 2

Figure 5:
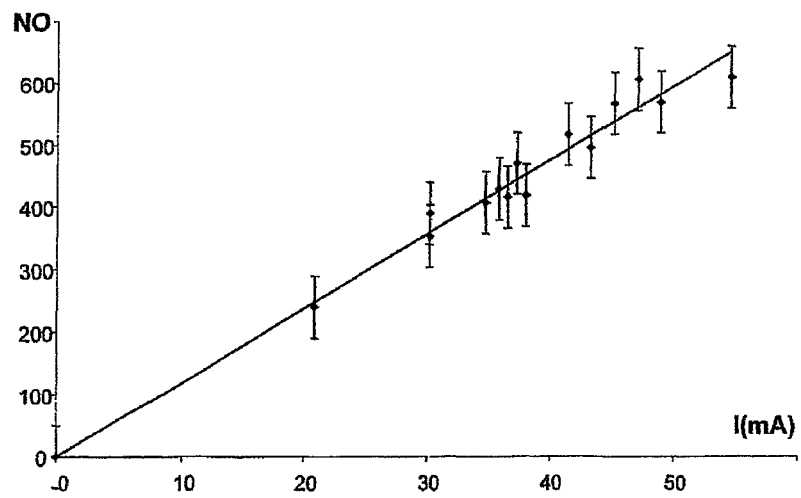
FIG. 5 shows the dependence of the oxygen radical density as a function of the intensity I of the current applied in the discharge.

FIG. 5 shows, using optical emission spectroscopy, that the density of active oxygenated species O. varies linearly with the intensity of the current applied in the discharge.

The discharge currents plotted in this figure were varied both at constant voltage, by varying the rate of application of the V, and therefore varying the impedance of the dielectric, and at constant frequency by varying the voltage. This FIG. 5 therefore shows that the density of active species depends only on the intensity of the discharge current and is not in any way influenced by the discharge voltage at constant current. This means that it is possible to obtain the same density of active species at power levels that differ only by the imposed voltage, the current remaining constant. However, it has been found that too high a voltage results in polymerization of the oil, which tends to inhibit the rate of oxidation of the organic residues present on the surface of the strip. In addition, industrial application requires the dissipation of a minimal energy density (less than 40 W/cm$^2$·s) in the discharge. Consequently, the discharge conditions needed for degreasing a strip are achieved by maximizing the current for a minimal imposed voltage.

The influence of the power of the discharge at constant current on the rate of degreasing is demonstrated in the table below, which combines two tests carried out by varying the frequency of the applied sinusoidal current:

| Discharge power (W) | Voltage (V) | Percentage degreasing | Frequency (kHz) |
|---|---|---|---|
| 110 | 3400 | 83% | 10 |
| 55 | 1720 | 87% | 20 |

It may therefore be seen that, at equal discharge current, and for an identical treatment time, the efficiency of the degreasing is better at lower voltage and therefore at lower power.

Example 3

Figure 6:
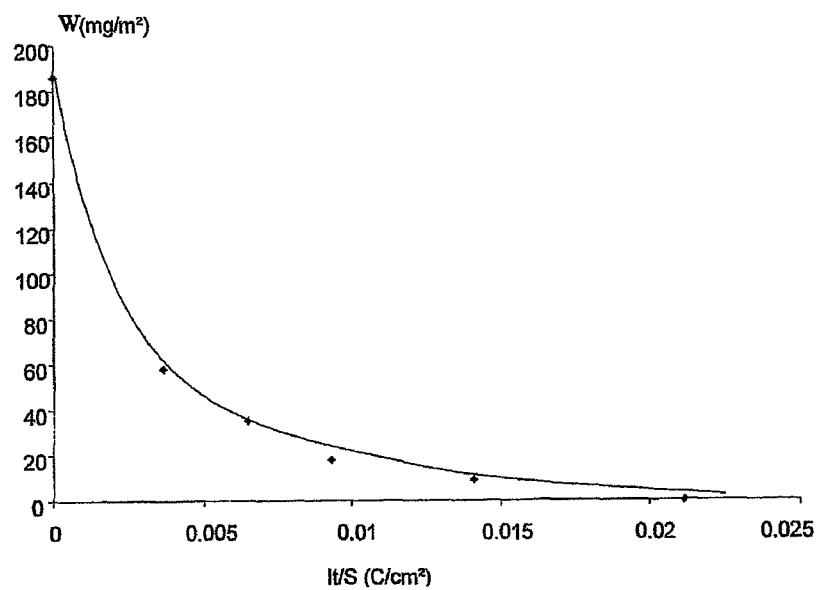
FIG. 6 shows the change in protective oil coating weight present on a strip as a function of the electron dose It/S which is applied to it.

A 20 cm$^2$ strip covered with 186 mg/m$^2$ of protective oil was treated by the process according to the invention. In the present case, the discharge was initiated in a stream of oxygen at a pressure of 350 mbar. The oxygen and/or ozone molecules formed from the recombined free radicals O. were not re-dissociated. FIG. 6 shows the change in coating weight of protective oil present on the strip as a function of the electron dose It/S (i.e. the electron current density multiplied by the treatment time). Application of the stream allows uniform treatment of the strip, which was confirmed by grazing-incidence infrared absorption spectroscopy (IRRAS).

Figure 7:
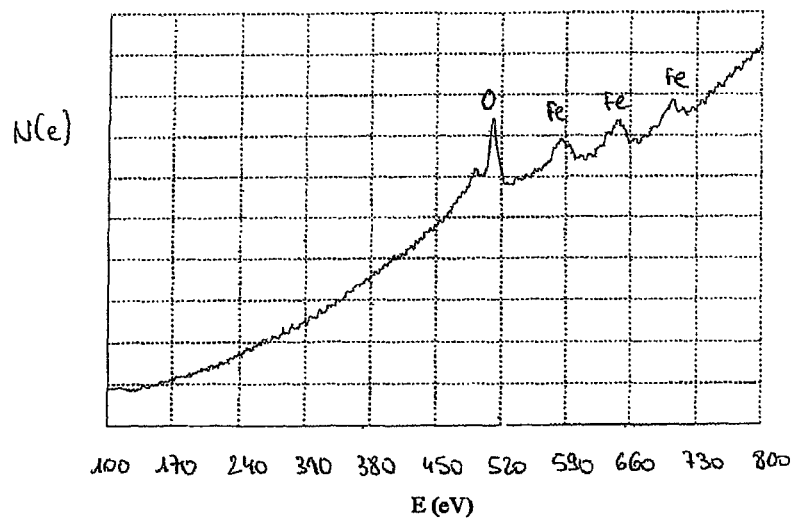
FIG. 7 shows the Auger electron spectrum of the surface of a strip degreased using a discharge involving an electron dose of 21 mC/cm$^2$.

FIG. 7 shows the Auger electron spectrum of the surface of the strip degreased using a discharge involving an electron dose of 21 mC/cm$^2$. Only the iron and oxygen peaks are present. The absence of a carbon peak around 273 eV confirms that the strip was completely degreased.

What is claimed is:

1. An installation for carrying out a process for cleaning the surface of a material coated with an organic substance, the process comprises introducing said material into a treatment chamber, having a pressure of between 10 mbar and 1 bar therein, which is supplied with a gas stream containing at least 90% oxygen by volume and generating a plasma by passing an electric discharge between the surface of said material and a dielectric-covered electrode, breaking down said organic substance through the action of the free radicals O. thus produced, where the material is in the form of a running strip and said introducing and generating operations are carried out continuously using installations placed in succession along the path of the running strip, the installation comprising:

at least one module comprising a treatment chamber,
means for setting the pressure inside said chamber to a value between 10 mbar and 1 bar, means for making said strip run through said chamber, a series of dielectric-covered electrodes placed so as to face that surface of said strip to be treated, where the electrodes are connected to a single sinusoidal high-voltage generator, a gas supplying unit that supplies said chamber with gas and a gas extraction unit that extracts, from said chamber, the gases resulting from the decomposition of the organic substance coating the strip, and UV emission lamps placed in an alternating order directly adjacent with said electrodes, wherein the UV emission lamps are configured to irradiate the strip at substantially the same time.

2. The installation as claimed in claim 1, wherein the oxygen and/or ozone molecules that are formed by recombination of the free radicals O. produced in said plasma are re-dissociated.

3. The installation as claimed in claim 2, wherein said re-dissociation is carried out using UV radiation of a suitable wavelength.

4. The installation as claimed in claim 3, wherein the suitable wavelength is approximately 253 nm.

5. The installation as claimed in claim 3, wherein the electrodes are covered with approximately 0.7 mm layer of alumina and of a ground metal and wherein the electrodes are spaced at approximately one to three tens of millimeters from each other.

6. The installation as claimed in claim 3, further comprising a cooling system that holds the electrodes at a temperature close to ambient temperature during operation of the plasma and wherein inter-electrode distance is varied.

7. The installation as claimed in claim 1, wherein the voltage applied to initiate the discharge is sinusoidal and has a frequency of between 10 and 100 kHz.

8. The installation as claimed in claim 1, wherein the energy dissipation in the discharge is less than 40 $W/cm^2$ and the voltage applied in order to initiate the discharge is less than 4.4 W.

9. The installation as claimed in claim 1, wherein one of the faces of said strip is treated followed in succession by the other.

10. The installation as claimed in claim 1, wherein said material to be treated is a metallic material.

11. The installation as claimed in claim 10, wherein said metallic material is a carbon steel.

12. The installation as claimed in claim 10, wherein said metallic material is steel.

13. The installation as claimed in 10, wherein the process degreases the surface of metallic materials, and further comprises depositing a coating after said degreasing.

14. The installation as claimed in claim 1, which comprises a succession of an even number of said modules, through which said strip runs in succession, exposing in turn one of its faces to the electrodes of said modules.

15. The installation as claimed in claim 1, wherein the process further comprises removing oil from the surface of metallic materials using the generated plasma.

16. The installation as claimed in claim 1, wherein:
the electrodes comprise a first electrode, a second electrode, and a third electrode,
the UV emission lamps comprise a first UV emission lamp, a second UV emission lamp, and a third UV emission lamp, and
the alternating order comprises the first electrode, the first UV emission lamp, the second electrode, the second UV emission lamp, the third electrode, and the third UV emission lamp.

17. The installation as claimed in claim 16, wherein the alternating order is provided with no elements in between and wherein the electrodes treat the strip together.

\* \* \* \* \*